(12) United States Patent  
Han et al.

(10) Patent No.: US 9,190,169 B2  
(45) Date of Patent: Nov. 17, 2015

(54) SHIFT REGISTER AND FLAT PANEL DISPLAY DEVICE HAVING THE SAME

(71) Applicant: LG DISPLAY CO., LTD., Seoul (KR)

(72) Inventors: HwaDong Han, Goyang (KR); ChongHun Park, Paju (KR); IlGi Jeong, Cheongwon-Gun (KR); JoonMin Park, Paju (KR)

(73) Assignee: LG Display Co., Ltd., Seoul (KR)

( * ) Notice: Subject to any disclaimer, the term of this patent is extended or adjusted under 35 U.S.C. 154(b) by 160 days.

(21) Appl. No.: 13/728,320

(22) Filed: Dec. 27, 2012

(65) Prior Publication Data

US 2014/0091997 A1 Apr. 3, 2014

(30) Foreign Application Priority Data

Sep. 28, 2012 (KR) ........................ 10-2012-0109245

(51) Int. Cl.
*G11C 19/00* (2006.01)
*G11C 19/28* (2006.01)
*G09G 3/36* (2006.01)

(52) U.S. Cl.
CPC .............. *G11C 19/28* (2013.01); *G09G 3/3611* (2013.01); *G09G 3/3677* (2013.01); *G09G 2310/0286* (2013.01); *G09G 2320/045* (2013.01)

(58) Field of Classification Search
None
See application file for complete search history.

(56) References Cited

U.S. PATENT DOCUMENTS

| 8,633,888 B2 * | 1/2014 | Kim et al. ..................... 345/100 |
| 8,731,136 B2 * | 5/2014 | Shin et al. ...................... 377/64 |
| 2006/0269038 A1 * | 11/2006 | Jang et al. ........................ 377/64 |
| 2007/0104307 A1 * | 5/2007 | Kim et al. ....................... 377/64 |
| 2011/0255653 A1 * | 10/2011 | Chae ................................. 377/79 |
| 2014/0091996 A1 * | 4/2014 | Moon et al. ..................... 345/92 |
| 2014/0092076 A1 * | 4/2014 | Lee ................................. 345/212 |

FOREIGN PATENT DOCUMENTS

| CN | 1157450 A | 8/1997 |
| CN | 1299124 A | 6/2001 |
| CN | 101515431 A | 8/2009 |

OTHER PUBLICATIONS

Chinese Office Action dated Aug. 7, 2015 for corresponding Chinese Application No. 201205991656, 16 pages.

* cited by examiner

*Primary Examiner* — Tuan T Lam

(74) *Attorney, Agent, or Firm* — Brinks Gilson & Lione

(57) ABSTRACT

A shift register of the present disclosure includes a plurality of stages. Each stage includes transistors belonging to a first group for activating a Q node, transistors belonging to a second group for discharging odd and even QB nodes, transistors belonging to a third group for being activated by the odd and even QB nodes and for discharging the Q node, and a sensing circuit for sensing a threshold voltage of at least one of the transistor belonging to the third group at a period when the Q node is discharged. The shift register of the present disclosure avoids the problem of erroneous operation due to lowering of device characteristics.

10 Claims, 5 Drawing Sheets

SHIFT REGISTER AND FLAT PANEL DISPLAY DEVICE HAVING THE SAME

CROSS-REFERENCE TO RELATED APPLICATION

Pursuant to 35 U.S.C. §119(a), this application claims the benefit of earlier filing date and right of priority to Korean Application No. 10-2012-0109245, filed on Sep. 28, 2012, the contents of which is incorporated by reference herein in its entirety.

BACKGROUND

1. Field of the Disclosure

This specification relates to a shift register, and particularly, to a shift register having a sensing circuit for quantitatively measuring a threshold voltage shifted level of a thin film transistor, which is deteriorated due to a continuously applied direct-current (DC) voltage, in a shift register having thin film transistors using oxide silicon as an active layer, and a flat panel display device having the same.

2. Background of the Disclosure

With the development of various portable devices such as mobile phones and notebook computers and information electronic devices such as HDTV for outputting images with high resolutions and high qualities, demands on flat panel display devices applied to those devices are gradually increasing. Examples of the flat panel display device include Liquid Crystal Display (LCD), Plasma Display Panel (PDP), Field Emission Display (FED), Organic Light Emitting Diode (OLED) and the like.

The flat panel display device requires a large substrate, such as glass, and a Thin Film Transistor (TFT), which is to be applied as a display device switching and driving element (component) having an excellent performance without an increase in costs. Among others, an amorphous silicon TFT (a-Si TFT) is a representative element which is widely used as an element which can be uniformly formed on a large substrate over 2 m in size with low costs.

However, with the trend of size-increases of the display device and a high image quality, high-performance elements are also required. Thus, there is a limit to using the conventional a-Si TFT, which exhibits about 0.5 $cm^2/Vs$ of mobility, as an element of a large flat panel display device.

Therefore, a high-performance TFT having mobility higher than the a-Si TFT and a fabrication technology therefor are needed. Also, the conventional a-Si TFT involves a problem in reliability, as the worst shortcoming, in that its initial performance is unable to be maintained due to its element characteristic being continuously deteriorated as it operates.

Many studies for overcoming the limit of the a-Si TFT have been continuously conducted, and a representative one is an oxide-silicon TFT.

The oxide-silicon TFT exhibits higher carrier mobility than the a-Si TFT. This may be very advantageous in implementing a driving circuit for controlling switching elements as well as the switching elements within a display panel disposed on the flat panel display device.

FIG. 1A is a schematic view showing a structure of a shift register for a flat panel display device according to the related art, and FIG. 1B is a view showing an equivalent circuit for one stage of the shift register shown in FIG. 1A.

The related art flat panel display device may include a shift register for applying gate output signals sequentially to each horizontal line of pixels on a display panel in order to display an image by sequentially turning on each pixel on the display panel.

As shown in FIG. 1A, a typical shift register includes a plurality of stages 1ST to nST for outputting output voltages Vout to gate lines formed on a display panel (not shown) in synchronization with a clock signal CLK. With the configuration, the first stage 1ST receives a start signal Vst to output a first gate output signal Vout-1 of high level for a first horizontal period 1H, and the second stage 2ST receives the first gate output signal Vout-1 as the start signal Vst to output a second gate output signal Vout-2 of high level. When the nth gate output signal Vout-n is finally output by the nth stage nST, an operation for one frame is completed.

Each of the stages 1ST to nST includes a plurality of transistors. FIG. 1B exemplarily shows one stage of a shift register having 8 transistors. As shown in FIG. 1B, one stage of the shift register includes a first transistor T1 and a sixth transistor T6 diode-connected to each other and turned on in response to a start signal Vst such that the first transistor T1 charges a Q node Q and the sixth transistor T6 discharges a QB node QB, a fifth transistor T5 turned on in response to charging of the Q node Q for discharging the QB node QB, a second transistor T2 for charging the QB node QB with a high potential driving voltage Vdd in response to a reverse clock signal CLKB, a third transistor T3 turned on in response to charging of the QB node QB for discharging the Q node Q, a fourth transistor T4 turned on in response to a reset signal RST for discharging the Q node Q and charging the QB node QB, a seventh transistor T7 electrically connected to one side of the charged Q node Q and turned on in response to the high voltage charged in the Q node Q for outputting a non-reverse clock signal CLK as an output signal Out therethrough, and an eighth transistor T8 turned on by the charged QB node QB for inducing the clock signal CLK outputted through the seventh transistor T7 to be lowered to a low potential.

As the TFT of the thusly configured shift register is implemented with oxide silicon TFTs, it is expected to highly improve performance by virtue of high mobility. However, in view of characteristics of the oxide silicon TFT, initial threshold voltage (int-threshold) characteristics are irregularly observed depending on positions, and the initial threshold voltage may be shifted on some of the TFTs. In particular, the third transistor T3 connected to the QB node QB, to which a high-level DC voltage is continuously applied for most of driving time, may be deteriorated. Accordingly, its device characteristics may change.

Consequently, the voltage level of the Q node Q connected to the third transistor T3 may be varied and thereby the gate output voltage Vout-n may not be regularly outputted due to an erroneous operation.

SUMMARY

A shift register includes transistors belonging to a first group for activating a Q node, transistors belonging to a second group for discharging odd and even QB nodes, and transistors belonging to a third group for activating the odd and even QB nodes and discharging the Q node, wherein the shift register may further include a sensing circuit to sense a threshold voltage of at least one of the transistors belonging to the third group.

There is also provided a flat panel display device including a display panel having a plurality of gate and data lines intersecting with each other to define pixels on the intersecting points, a gate driving unit mounted onto one side of the display panel, and including a shift register having a plurality of stages for outputting a gate output signal to the gate lines, and a data driving unit disposed on one side of the display panel to output a data voltage to the data lines in response to the output signal, wherein the shift register may include transistors belonging to a first group for activating a Q node, transistors belonging to a second group for discharging odd and even QB nodes, and transistors belonging to a third group for activating the odd and even QB nodes and discharging the Q node, wherein at least one of the transistors belonging to the third group may be connected to a sensing circuit to sense a level of threshold voltage shift.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE EXEMPLARY EMBODIMENTS

A description will now be given in detail of a shift register and a flat panel display device having the same according to the exemplary embodiments, with reference to the accompanying drawings. For the sake of brief description with reference to the drawings, the same or equivalent components will be provided with the same reference numbers, and description thereof will not be repeated.

Figure 1A:
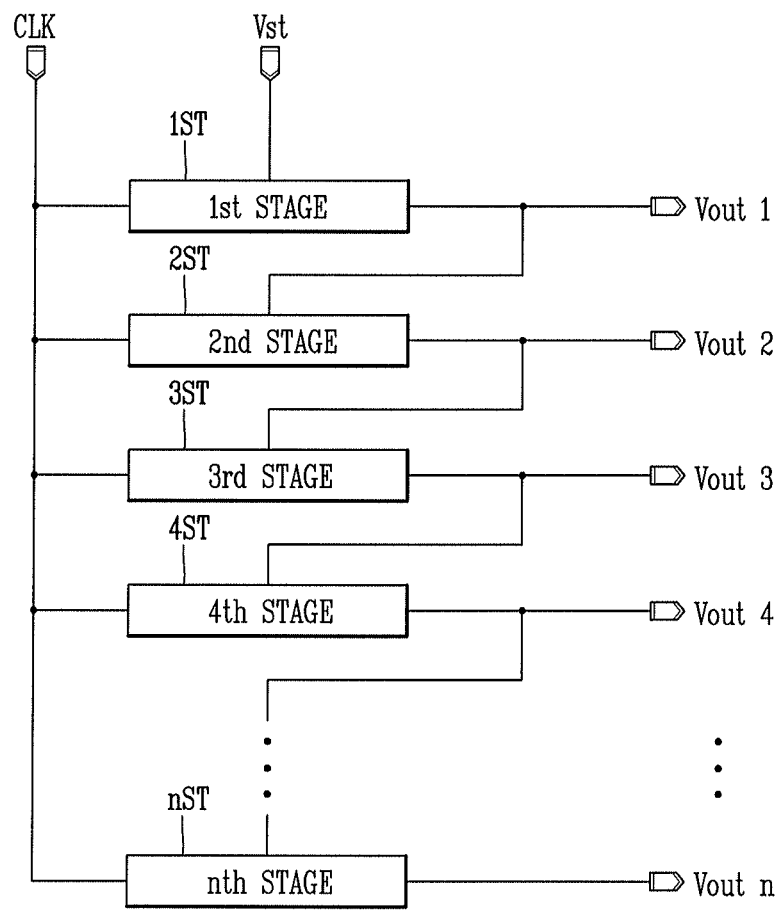
FIG. 1A is a schematic view showing a structure of a shift register for a flat panel display device according to the related art.
Figure 1B:
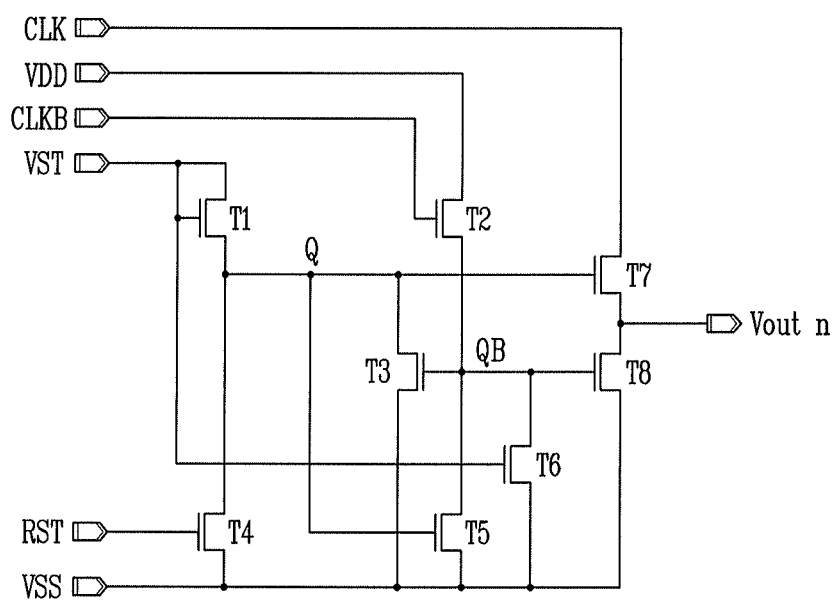
FIG. 1B is an equivalent circuit view of one stage of the shift register shown in FIG. 1A.
Figure 2:
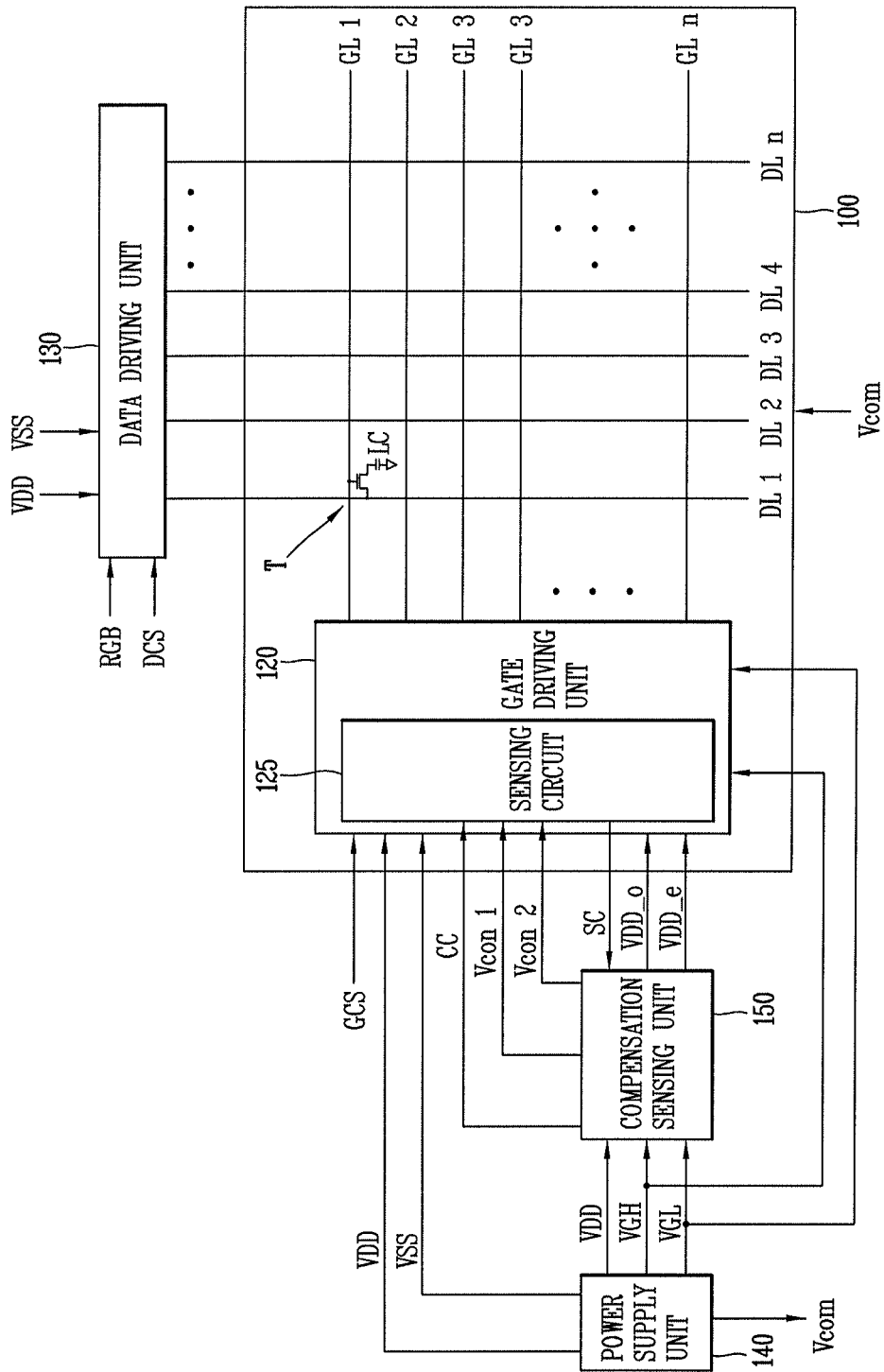
FIG. 2 is a view showing an overall structure of a flat panel display device having a shift register in accordance with one exemplary embodiment.

FIG. 2 shows an overall structure of a flat panel display device having a shift register in accordance with one exemplary embodiment, which shows an example applied to a widely used liquid crystal display device of flat panel display devices.

As shown in FIG. 2, an LCD device having a shift register according to the present disclosure may include a liquid crystal panel 100 having a plurality of pixels defined for displaying images, a gate driving unit 120 mounted onto one side of the liquid crystal panel 100 for applying a gate output voltage to each of gate lines GL1 To GLn, a data driving unit 130 for applying a data voltage to each pixel, a power supply unit 140 for generating and supplying various driving voltages necessary to drive the liquid crystal panel 100 and the driving units 120 and 130, and a compensation sensing unit 150 connected to the gate driving unit 120 for sensing a level of threshold voltage shift in each TFT and regularly driving a deteriorated transistor by adjusting a part of voltages applied to the gate driving unit 120 according to the sensing result.

The liquid crystal panel 100 may include a plurality of gate lines GL1 to GLn and a plurality of data lines DL1 to DLm intersecting with each other in a matrix configuration on a glass or plastic substrate to define a plurality of pixel regions on the intersecting points. A plurality of pixels corresponding to three primary colors of RBG, respectively, may be formed on each pixel region of the liquid crystal panel 100 in a matrix pattern. Each pixel may include at least one TFT T and liquid crystal capacitor LC to display an image.

In the TFT T, a gate electrode may be connected to the gate line GL1~GLn, a source electrode may be connected to the data line DL1~DLm, and a drain electrode may be connected to a pixel electrode facing a common electrode so as to define one pixel. The TFT T has a bottom gate structure that the gate electrode is formed on a lower side of an active layer. Amorphous silicon is widely used as a material of the active layer of the TFT T. However, the active layer of the TFT T of the LCD device according to the present disclosure may preferably be made of oxide silicon.

The gate driving unit 120 may be a shift register, which is located on one of peripheral regions of a pixel region of the liquid crystal panel 100 and has a plurality of stages each including a plurality of TFTs. The gate driving unit 120 may be formed simultaneously with the TFTs on the pixel regions of the liquid crystal panel 100 through the same process. Therefore, the shift register may be implemented with the oxide silicon TFTs. The gate driving unit 120 has a structure that the mounted TFTs are divided into odd and even intervals to be driven at individual timing, respectively.

Each state of the shift register may further include a sensing circuit 125 for sensing a level of threshold voltage shift with respect to a specific TFT. The sensing circuit 125 may be connected to a compensation sensing unit 150 to be explained later.

The gate driving unit 120 may sequentially output a gate high-level output voltage VGH per each horizontal period (interval) 1H via the gate lines GL1 to GLn formed on the liquid crystal panel 100, in response to a gate control signal GCS inputted from a timing controller (not shown). The other gate lines on which the gate high-level output voltage VGH is not outputted may maintain a gate low-level output voltage VGL for one frame interval.

The gate control signal may include a Gate Start Pulse (GSP), a Gate Shift Clock (GSC), a Gate Output Enable (GOE) or the like.

Accordingly, the TFT T connected to the corresponding gate line GL1~GLn may be turned on, and simultaneously a date voltage with an analog waveform supplied from the data driving unit 130 may be applied to pixels connected to the TFTs via the data lines DL1~DLm.

The data driving unit 130 may receive a data control signal DCS and a digital image signal RGB from the timing controller (not shown). The data driving unit 130 may then convert the image signal RGB into a data voltage in an analog form according to a reference voltage, in response to the data control signal DCS, so as to apply the analog data voltage to each pixel via the data lines DL1~DLm. Here, the data driving unit 130 may output the data voltage for every pixel arranged on one horizontal line in response to a gate output signal.

The data control signal DCS may include a Source Start Pulse (SSP), a Source Shift Clock (SSC), a Source Output Enable (SOE) or the like.

Also, the data driving unit 130 may be configured as a separate Integrated Circuit (IC) to be attached onto a non-display region of the liquid crystal panel 100 in a TAB or OOG manner so as to be connected to each pixel in a perpendicular direction via the data lines DL1~DLm.

The power supply unit 140 may generate and supply a power voltage VDD, a ground voltage VSS and a common voltage Vcom for driving the liquid crystal panel 100 and the gate and data driving units 120 and 130. Especially, the power supply unit 140 may generate a gate high-level voltage VGH and a gate low-level voltage VGL for defining an upper limit and a lower limit of the gate output voltage, to supply to the gate driving unit 120 and the compensation sensing unit 150.

The compensation sensing unit 150 may be connected to the gate driving unit 120. Each stage of the gate driving unit 120 may include a sensing circuit 125 for sensing a level of threshold shift of the TFTs. The compensation sensing unit 150 may control the sensing circuit 125 based on first and second sensing control signals Vcon1 and Vcon2 and constant current CC and receive the sensing result signal SC. The compensation sensing unit 150 may sense the level of the threshold shift of the TFTs of the gate driving unit 120 according to the received sensing result signal. Especially, while the gate driving unit 120 is driven by being divided into odd and even periods, the compensation sensing unit 150 may compensate for voltage levels of an odd power supply voltage VDD_o and an even power supply voltage VDD_e, which are required for the division driving, by the shifted threshold voltage value, and provide the compensated voltages to the gate driving unit 120.

With the configuration of the LCD device having the shift register, the compensation sensing unit 150 may sense the level of the threshold voltage shift of each TFT of the shift register, and compensate for a deteriorated TFT by varying the two power supply voltages required for driving the shift register according to the sensing result.

Hereinafter, a shift register and a sensing circuit thereof in accordance with one exemplary embodiment will be described with reference to the accompanying drawings.

Figure 3:
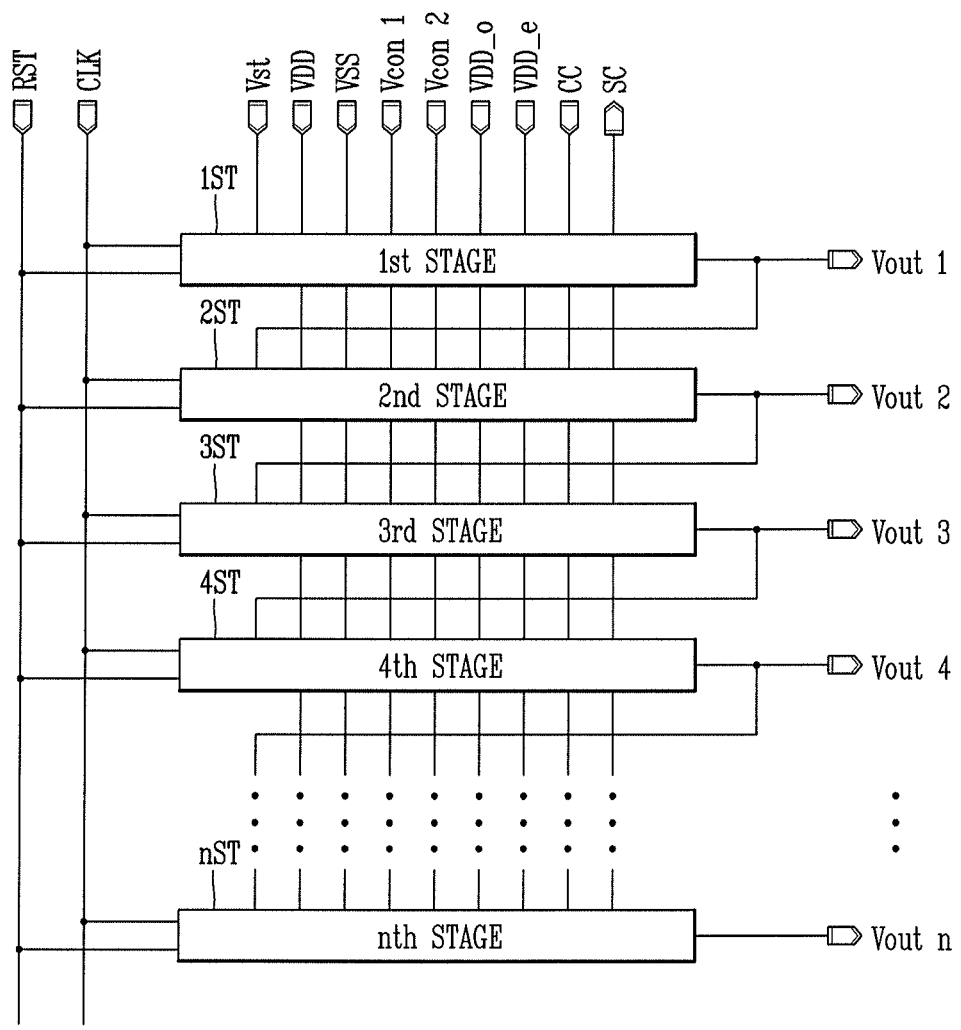
FIG. 3 is a view showing a shift register in accordance with one exemplary embodiment.

FIG. 3 is a view showing a shift register in accordance with one exemplary embodiment.

As shown in FIG. 3, a shift register according to the present disclosure may include a plurality of stages 1ST~nST for outputting gate output voltages Vout to the gate lines in synchronization with a clock signal CLK.

Although not shown, the shift register may include a plurality of stages each being equivalent to a pull-up transistor, a pull-down transistor and a flip flop, and configured to sequentially output a gate high-level voltage VGH for one horizontal period (1H) in response to at least one clock signal and a start signal. Also, each of the plurality of stages may be provided with a sensing circuit for sensing a level of threshold voltage shift with respect to a specific transistor. A plurality of clock signals having different phases may be used as the clock signal CLK.

Each stage 1ST~nST may be provided with an odd power supply voltage VDD_o and an even power supply voltage VDD_e for driving the shift register by dividing one frame into an odd period and an even period, as well as typical power supply voltage VDD and ground voltage VSS. The general start signal Vst may be inputted to the first stage 1ST and gate output signals of preceding stages may be inputted as the start signals to the other stages 2ST~nST except for the first stage 1ST. In addition, first and second sensing control signals Vcon1 and Vcon2 for control of an internal sensing circuit and a constant current signal CC applied to the sensing circuit may be provided to each stage 1ST~nST. A sensing result signal SC indicating a current change may be outputted to a compensation sensing unit. In the shift register, the succeeding stages 2ST~nST except for the first stage 1ST may receive the gate output signals as the start signals from the preceding stages.

Figure 4:
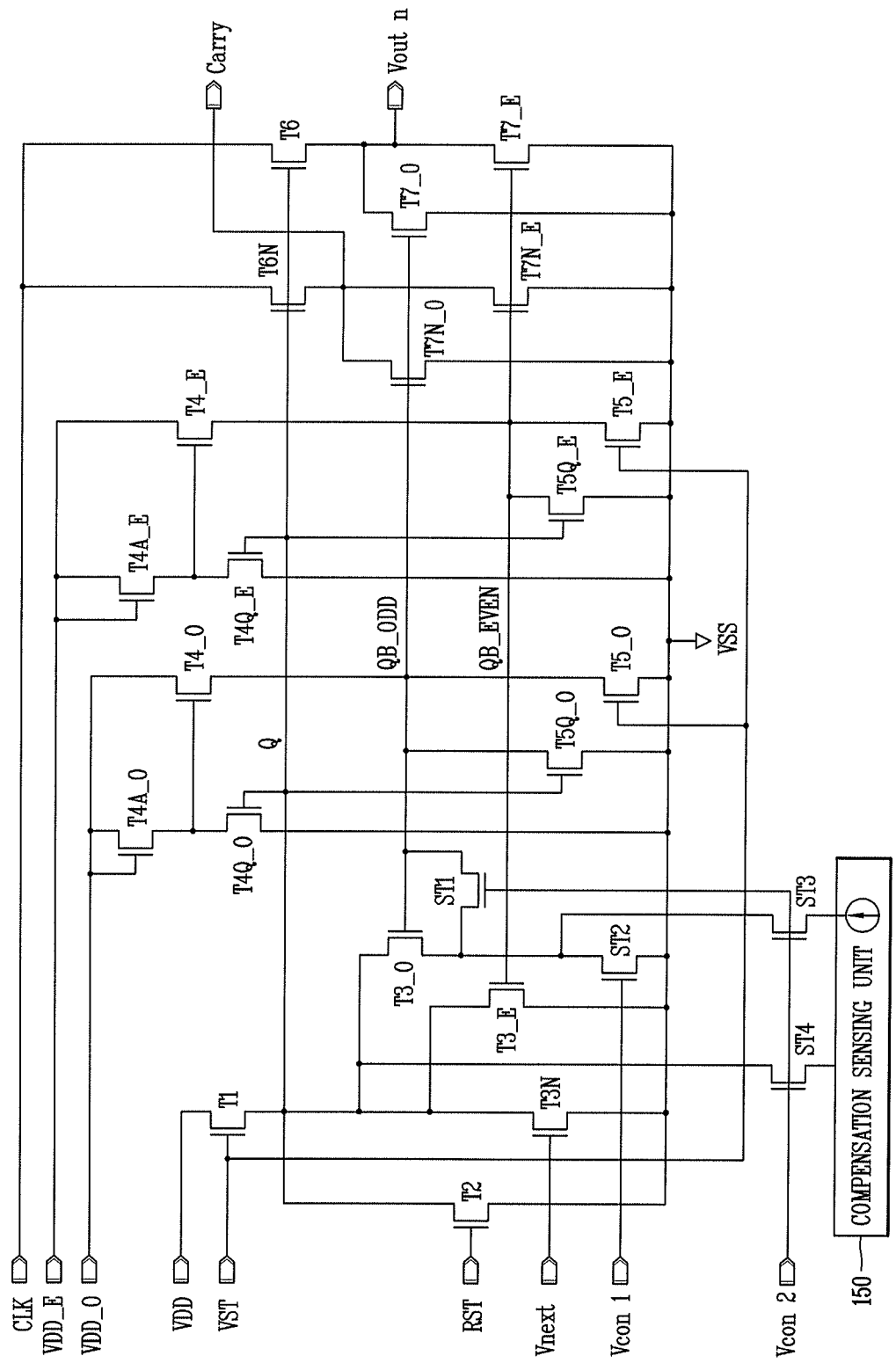
FIG. 4 is an equivalent circuit view showing one of stages included in the shift register of FIG. 3.

FIG. 4 is an equivalent circuit view of one of stages constructing the shift register of FIG. 3.

As shown in FIG. 4, one stage of the shift register may be implemented with a plurality of oxide silicon TFTs.

Each TFT may be divided into first and sixth transistors T1 and T6 belonging to a first group and configured to activate a Q node Q for outputting a gate output signal Vout-n of high level in a current stage, a second transistor T2 for a reset operation, fourth and fifth transistors T4 and T5 belonging to a second group and configured to discharge odd and even QB nodes QB_ODD and QB_EVEN, and third and seventh transistors T3 and T7 belonging to a third group and configured to activate the odd and even QB nodes QB_ODD and QB_EVEN for outputting gate output signals Vout-n of low level in a current stage and to discharge the Q node Q. The third to seventh transistors T3 to T7 may be divided into a predetermined number of transistors according to their functions.

The first transistor T1 may be connected to a power supply voltage (VDD) end and the Q node Q, and apply the power supply voltage VDD to the Q node Q in response to a start signal Vst or a preceding stage output signal Vout n-1.

The second transistor T2 may be connected between the Q node Q and the ground voltage (VSS) end, and discharge a voltage applied to the Q node Q in response to a reset signal RST.

The third transistor T3N may be connected between the Q node Q and the ground voltage (VSS) end, and discharge a voltage applied from a succeeding stage to the Q node Q in response to the next signal Vnext. The next signal Vnext may be a gate output signal Vout n+1 or a carry signal of the succeeding stage.

A 3_O transistor T3_O may be connected between the first transistor T1 and the third transistor T3N, namely, between an extending line of the Q node Q and the ground voltage end, and discharge the Q node Q when the odd QB node QB_ODD transits into a high level.

A 3_E transistor T3_E may be connected between the first transistor T1 and the third transistor T3N, namely, between the extending line of the Q node Q and the ground voltage end, and discharge the Q node Q when the even QB node QB_EVEN transits into a high level voltage.

A 4A_O transistor T4A_O may be diode-connected, and connected between an odd power supply voltage (VDD_O) end and the 4Q_O transistor T4Q_O. The 4A_O transistor T4A_O may turn on the 4_O transistor T4_O when an odd power supply voltage VDD_O of high level is applied.

The 4_O transistor T4_O may be connected between the odd power supply voltage (VDD_O) end and the odd QB node QB_ODD, and charge the odd QB node QB_ODD with a high-level voltage when an odd power supply voltage VDD_O of high level is applied from the 4A_O transistor T4A_O.

A 4Q_O transistor T4Q_O may be connected between the 4A_O transistor T4A_O and the ground voltage end, and turn off the 4A_O transistor T4A_O when the Q node Q is charged with a high-level voltage.

A 4A_E transistor T4A_E may be diode-connected and connected between the even power supply voltage (VDD_E) end and the 4Q_E transistor T4Q_E. The 4A_E transistor T4A_E may turn on the 4_E transistor T4_E when the even power supply voltage VDD_E of high level is applied.

A 4_E transistor T4_E may be connected between the even power supply voltage end and the even QB node QB_EVEN, and charge the even QB node QB_EVEN with a high-level voltage when the even power supply voltage VDD_E of high level is applied from the 4A_E transistor T4A_E.

A 4Q_E transistor T4Q_E may be connected between the 4A_E transistor T4A_E and the ground voltage end, and turn off the 4A_E transistor T4A_E when the Q node Q is charged with a high-level voltage.

A 5Q_O transistor T5Q_O may be connected between the odd QB node QB_ODD and the ground voltage end, and discharge the odd QB node QB_ODD when the Q node Q is charged with a high-level voltage.

A 5_O transistor T5_O may be connected between the odd QB node QB_ODD and the ground voltage end, and discharge the odd QB node QB_ODD when the start signal Vst is applied.

A 5Q_E transistor T5Q_E may be connected between the even QB node QB_EVEN and the ground voltage end, and discharge the even QB node QB_EVEN when the Q node Q is charged with a high-level voltage.

A 5_E transistor T5_E may be connected between the even QB node QB_EVEN and the ground voltage (VSS) end, and discharge the even QB node QB_EVEN when the start signal Vst is applied.

The sixth transistor T6 may be connected between a clock signal (CLK) end and an output signal (Vout n) end, and output the clock signal CLK as a gate output signal Vout N when the Q node Q is charged with a high-level voltage.

A 6N transistor T6N may be connected between the clock signal (CLK) end and a carry signal end, and output the clock signal CLK as the carry signal when the Q node Q is charged with a voltage of high level.

A 7N_O transistor T7N_O may be connected between the carry signal end and the ground voltage (VSS) end, and stop the outputting of the carry signal when the odd QB node QB_ODD is charged with a high-level voltage.

A 7N_E transistor T7N_E may be connected between the carry signal end and the ground voltage (VSS) end, and stop the outputting of the carry signal when the even QB node QB_EVEN is charged with a high level-voltage.

A 7_O transistor T7_O may be connected between the output signal (Vout n) end and the ground voltage (VSS) end, and output a gate output signal (Vout n) of low level when the odd QB node QB_ODD transits into a high level voltage.

A 7_E transistor T7_E may be connected between the output signal (Vout n) end and the ground voltage (VSS) end, and output a gate output signal (Vout n) of low level when the even QB node QB_EVEN transits into a high level voltage.

In the shift register having the configuration, the odd power supply voltage VDD_O and the even power supply voltage VDD_E may have opposite phases to each other. Hence, the odd QB node QB_ODD and the even QB node QB_EVEN may be alternately charged with and discharge voltages having different phases when the shift register is driven. This may result in preventing deterioration of TFTs whose gates are connected to the odd QB node QB_ODD and the even QB node QB_EVEN.

However, a predetermined threshold voltage shifting of the TFT may be caused due to driving for a long-term of time. Therefore, the shift register according to the present disclosure may further include a sensing circuit for sensing a level of the threshold voltage shift of each TFT to increase reliability of a device, and compensating for deterioration of the TFT when happened.

The sensing circuit may include first to fourth ST transistors ST1 to ST4.

The first to fourth ST transistors ST1 to ST4 may be electrically connected to at least one of the 3_O, 3_E, 7N_O, 7N_E, 7_O and 7_E transistors T3_O, T3_E, T7N_O, T7N_E, T7_O and T7_E, which are easily deteriorated due to being connected to the odd QB node QB_ODD and the even QB node QB_EVEN. The drawing exemplarily shows that the sensing circuit is connected to the 3_O transistor T3_O.

As shown, the first ST transistor ST1 of the sensing circuit may be connected between the odd QB node QB_ODD and one electrode of the 3_O transistor T3_O, and diode-connect the 3_O transistor T3_O in response to a second sensing control signal Vcon2.

The second ST transistor ST2 may be connected between the one electrode of the 3_O transistor T30 and the ground voltage (VSS) end, and electrically disconnect the 3_O transistor T3_O from the ground voltage (VSS) end in response to a first sensing control signal Vcon1.

The third ST transistor ST3 may be connected between the 3_O transistor T3_O and the second ST transistor ST2, and electrically connect the 3_O transistor T3_O to the constant current supply CC in response to the second sensing control signal Vcon2.

The fourth ST transistor ST4 may be connected between another electrode of the 3_O transistor T3_O and the ground voltage (VSS) end, and allow a current, which flows via the 3_O transistor T3_O, to be applied to the compensation sensing unit 150 in response to the second sensing control signal Vcon2.

With the configuration, the shift register may be typically driven as the compensation sensing unit 150 may apply the first sensing control signal Vcon1 of high level and apply the second sensing control signal Vcon2 of low level.

While sensing a level of threshold voltage shift of the TFT of the shift register, the compensation sensing unit 150 may apply the first sensing control signal Vcon1 of low level and the second sensing control signal Vcon2 of high level at a period for which the Q node Q is discharged. Also, the constant current supply CC may apply a current of about 10 uA to the third ST transistor ST3. Accordingly, the first ST transistor ST1 may be turned on to allow the 3_O transistor ST3_O to be diode-connected, and the second ST transistor ST2 may be turned off to block the ground voltage VSS applied to the one electrode of the 3_O transistor T3_O. Also, since the fourth ST transistor ST4 is turned on, the compensation sensing unit 150 may receive a current shifted according to the threshold voltage of the 3_O transistor T3_O and calculate the level of the threshold voltage shift based on the shifted amount.

Also, in response to the calculated level of the threshold voltage shift, the voltage levels of the odd power supply voltage VDD_O and the even power supply voltage VDD_E may be adjusted into the range that the shift register can be stably driven, solving an erroneous operation caused due to the threshold voltage shifting.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A shift register comprising:
a plurality of stages, each stage comprising:
transistors belonging to a first group for activating a Q node;
transistors belonging to a second group for discharging odd and even QB nodes;
transistors belonging to a third group for being activated by the odd and even QB nodes and for discharging the Q node, wherein the transistors belonging to the third group includes a target transistor, the target transistor being connected to the odd QB node; and
a sensing circuit for sensing a threshold voltage of the target transistor at a period when the Q node is discharged;
wherein the sensing circuit controls electrical disconnection of the target transistor from a ground voltage based on a first sensing control signal, and
wherein the sensing circuit selectively allows the target transistor to be diode-connected and connected to a constant current supply based on a second sensing control signal, and selectively allows a current flowing via the target transistor to be applied to the sensing circuit based on the second sensing control signal.

2. The shift register of claim 1, wherein the transistors of the first group comprise:
a first transistor connected between a power supply voltage end and the Q node to apply a power supply voltage to the Q node in response to a start signal or a preceding stage output signal; and
a sixth transistor connected between a clock signal end and an output signal end to output the clock signal as a gate output signal when the Q node is charged with a high level voltage.

3. The shift register of claim 2, wherein the transistors of the first group further comprise a 6N transistor connected between the clock signal end and a carry signal end to output the clock signal as a carry signal when the Q node is charged with a high level voltage.

4. The shift register of claim 1, wherein the transistors of the second group comprise:
a 4A_O transistor diode-connected, and connected between an odd power supply voltage end and a 4Q_O transistor, the 4A_O transistor turning a 4_O transistor when an odd power supply voltage of high level is applied;
a 4_O transistor connected between the odd power supply voltage end and the odd QB node, the 4_O transistor charging the odd QB node with a high level voltage when an odd power supply voltage of high level is applied from the 4_AO transistor;
a 4Q_O transistor connected between the 4A_O transistor and the ground voltage end, the 4Q_O transistor turning off the 4A_O transistor when the Q node is charged with a high level voltage;
a 4A_E transistor diode-connected, and connected between the even power supply voltage end and the 4Q_E transistor, the 4A_E transistor turning on the 4_E transistor when an even power supply voltage of high level is applied;
a 4_E transistor connected between the even power supply voltage end and the even QB node, the 4_E transistor charging the even QB node with a high level voltage when an even power supply voltage of high level is applied from the 4A_E transistor;
a 4Q_E transistor connected between the 4A_E transistor and the ground voltage end, the 4Q_E transistor turning off the 4A_E transistor when the Q node is charged with a high level voltage;
a 5Q_O transistor connected between the odd QB node and the ground voltage end, the 5Q_O transistor discharging the odd QB node when the Q node is charged with a high level voltage;
a 5_O transistor connected between the odd QB node and the ground voltage end, the 5_O transistor discharging the odd QB node when a start signal is applied;
a 5Q_E transistor connected between the even QB node and the ground voltage end, the 5Q_E transistor discharging the even QB node when the Q node is charged with a high level voltage; and
a 5_E transistor connected between the even-numbered QB node and the ground voltage end, the 5_E transistor discharging the odd QB node when the start signal is applied.

5. The shift register of claim 4, wherein the odd power supply voltage and the even power supply voltage are voltage signals compensated for based on a level of threshold voltage shift sensed by the sensing circuit.

6. The shift register of claim 1, wherein the transistors of the third group comprise:
a 3N transistor connected between the Q node and the ground voltage end, the 3N transistor discharging the Q node in response to the next signal applied from the succeeding stage;
a 3_O transistor connected between the Q node and the ground voltage end, the 3_O transistor discharging the Q node when the odd QB node transits into a high level;
a 3_E transistor connected between the Q node and the ground voltage end, the 3_E transistor discharging the Q node when the even QB node transits into a high level;
a 5Q_O transistor connected between the odd QB node and the ground voltage end, the 5Q_O transistor discharging the odd QB node when the Q node is charged with a high level voltage;
a 5_O transistor connected between the odd QB node and the ground voltage end, the 5_O transistor discharging the odd QB node when the start signal is applied;
a 5Q_E transistor connected between the even QB node and the ground voltage end, the 5Q_E transistor discharging the even QB node when the Q node is charged with a high level voltage;
a 5_E transistor connected between the even QB node and the ground voltage end, the 5_E transistor discharging the odd QB node when the start signal is applied;
a 7N_O transistor connected between a carry signal end and the ground voltage end, the 7N_O transistor stopping the output of a carry signal when the odd QB node is charged with a high level voltage;
a 7N_E transistor connected between the carry signal end and the ground voltage end, the 7N_E transistor stopping the output of the carry signal when the even QB node is charged with a high level voltage;
a 7_O transistor connected between the output signal end and the ground voltage end, the 7_O transistor outputting a gate output signal of low level when the odd QB node transits into a high level; and a 7_E transistor connected between the output signal end and the ground voltage end, the 7_E transistor outputting a gate output signal of low level when the even QB node transits into a high level.

7. The shift register of claim 5, wherein the odd power supply voltage and the even power supply voltage are voltage signals compensated for based on a level of threshold voltage shift sensed by the sensing circuit.

8. A shift register comprising:
transistors belonging to a first group for activating a Q node;
transistors belonging to a second group for discharging odd and even QB nodes;
transistors belonging to a third group for being activated by the odd and even QB nodes and for discharging the Q node; and
a sensing circuit for sensing a threshold voltage of at least one of the transistors belonging to the third group,
wherein the sensing circuit comprises:
a first ST transistor connected between the odd QB node and one electrode of a target transistor, the first ST transistor allowing the target transistor to be diode-connected in response to a second sensing control signal;
a second ST transistor connected between one electrode of the target transistor and the ground voltage end, the second ST transistor electrically disconnecting the target transistor from the ground voltage end in response to a first sensing control signal;
a third ST transistor connected between the target transistor and the second ST transistor, the third ST transistor electrically connecting the target transistor to a constant current supply in response to the second sensing control signal; and
a fourth ST transistor connected between another electrode of the target transistor and the ground voltage end, the fourth ST transistor allowing a current flowing via the target transistor to be applied to the sensing circuit in response to the second sensing control signal.

9. The shift register of claim 8, wherein the target transistor is electrically connected to at least one of the transistors connected to the odd QB node and the even QB node.

10. A shift register comprising:
a plurality of stages, each stage comprising:
transistors belonging to a first group for activating a Q node;
transistors belonging to a second group for discharging odd and even QB nodes;
transistors belonging to a third group for being activated by the odd and even QB nodes and for discharging the Q node, wherein the transistors belonging to the third group includes a target transistor, the target transistor being connected to the odd QB node; and
a sensing circuit for sensing a threshold voltage of the target transistor at a period when the Q node is discharged;
wherein the sensing circuit controls electrical disconnection of the target transistor from a ground voltage, and
wherein the sensing circuit selectively allows the target transistor to be diode-connected and connected to a constant current supply, and selectively allows a current flowing via the target transistor to be applied to the sensing circuit.

* * * * *